United States Patent
Fowler

(10) Patent No.: US 6,633,028 B2
(45) Date of Patent: Oct. 14, 2003

(54) ANTI-BLOOMING CIRCUIT FOR CMOS IMAGE SENSORS

(75) Inventor: Boyd Fowler, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/931,983

(22) Filed: Aug. 17, 2001

(65) Prior Publication Data

US 2003/0034433 A1 Feb. 20, 2003

(51) Int. Cl.$^7$ .............................................. H01L 27/00
(52) U.S. Cl. ............................... 250/208.1; 250/214 A; 257/223
(58) Field of Search ........................ 250/208.1, 214 A, 250/214 C, 214 SW; 257/223, 230, 445; 348/308, 314; 438/79

(56) References Cited

U.S. PATENT DOCUMENTS

| | | | |
|---|---|---|---|
| 5,198,660 A | * | 3/1993 | Yokoyama et al. ..... 250/214 A |
| 5,767,724 A | * | 6/1998 | Steglich ...................... 327/323 |
| 5,900,623 A | * | 5/1999 | Tsang et al. ............. 250/208.1 |

FOREIGN PATENT DOCUMENTS

JP          04-359479 A     *  11/1999

* cited by examiner

Primary Examiner—Thanh X. Luu

(57) ABSTRACT

An improved image sensor constructed from a photodiode and a transimpedance amplifier having an input connected to the photodiode. The present invention utilizes a clamping circuit to prevent the potential at the input of the transimpedance amplifier from causing the photodiode to become forward biased. In the preferred embodiment of the present invention, the transimpedance amplifier includes a transistor connecting the input to the output, and the clamping circuit includes a circuit for holding the gate of the transistor at a clamping potential.

1 Claim, 2 Drawing Sheets

ANTI-BLOOMING CIRCUIT FOR CMOS IMAGE SENSORS

FIELD OF THE INVENTION

The present invention relates to CMOS image sensors, and more particularly, to CMOS image sensors that utilize capacitive transimpedance amplifiers.

BACKGROUND OF THE INVENTION

In principle, CMOS image sensors provide a number of advantages over CCD image sensors. The CMOS yields are significantly better than those of the CCD fabrication process. In addition, the minimum noise levels achievable with CMOS-based sensors are substantially lower than those that can be obtained with CCDs.

Unfortunately, CMOS image sensors based on arrays of photodiodes suffer from a phenomenon known as "blooming". When light strikes a photodiode, electron-hole pairs are generated. The electrons are swept into the diode by the electric field across the diode. Normally the diode is reverse biased and the collected electrons reduce the potential across the diode by discharging a capacitor that is connected in parallel with the diode. Image sensor arrays measure the number of photoelectrons that are collected by each photodiode during a predetermined exposure period.

Consider an array of photodiodes in which one of the photodiodes is exposed to a strong light source. The photocurrent from that photodiode can become sufficiently large to discharge the capacitor and cause the photodiode to become forward biased. In this case, a large current flows through that photodiode from the amplifier to ground. Electrons from this current can reach neighboring photodiodes and be collected by the neighboring photodiodes. These electrons are indistinguishable from the photoelectrons that would be generated in the neighboring photodiodes if those photodiodes had been subjected to light. Hence, the neighboring photodiode appears to be irradiated with light also. Accordingly, a small, high-intensity, light irradiation pattern appears to "bloom" into a much larger pattern.

Broadly, it is the object of the present invention to provide an improved CMOS image sensor, which is less sensitive to blooming.

These and other objects of the present invention will become apparent to those skilled in the art from the following detailed description of the invention and the accompanying drawings.

SUMMARY OF THE INVENTION

The present invention is an improved image sensor constructed from a photodiode and a transimpedance amplifier having an input connected to the photodiode. The present invention utilizes a clamping circuit to prevent the potential at the input of the transimpedance amplifier from causing the photodiode to become forward biased. In the preferred embodiment of the present invention, the transimpedance amplifier includes a transistor connecting the input to the output, and the clamping circuit includes a circuit for holding the base of the transistor at a clamping potential.

DETAILED DESCRIPTION OF THE INVENTION

Figure 1:
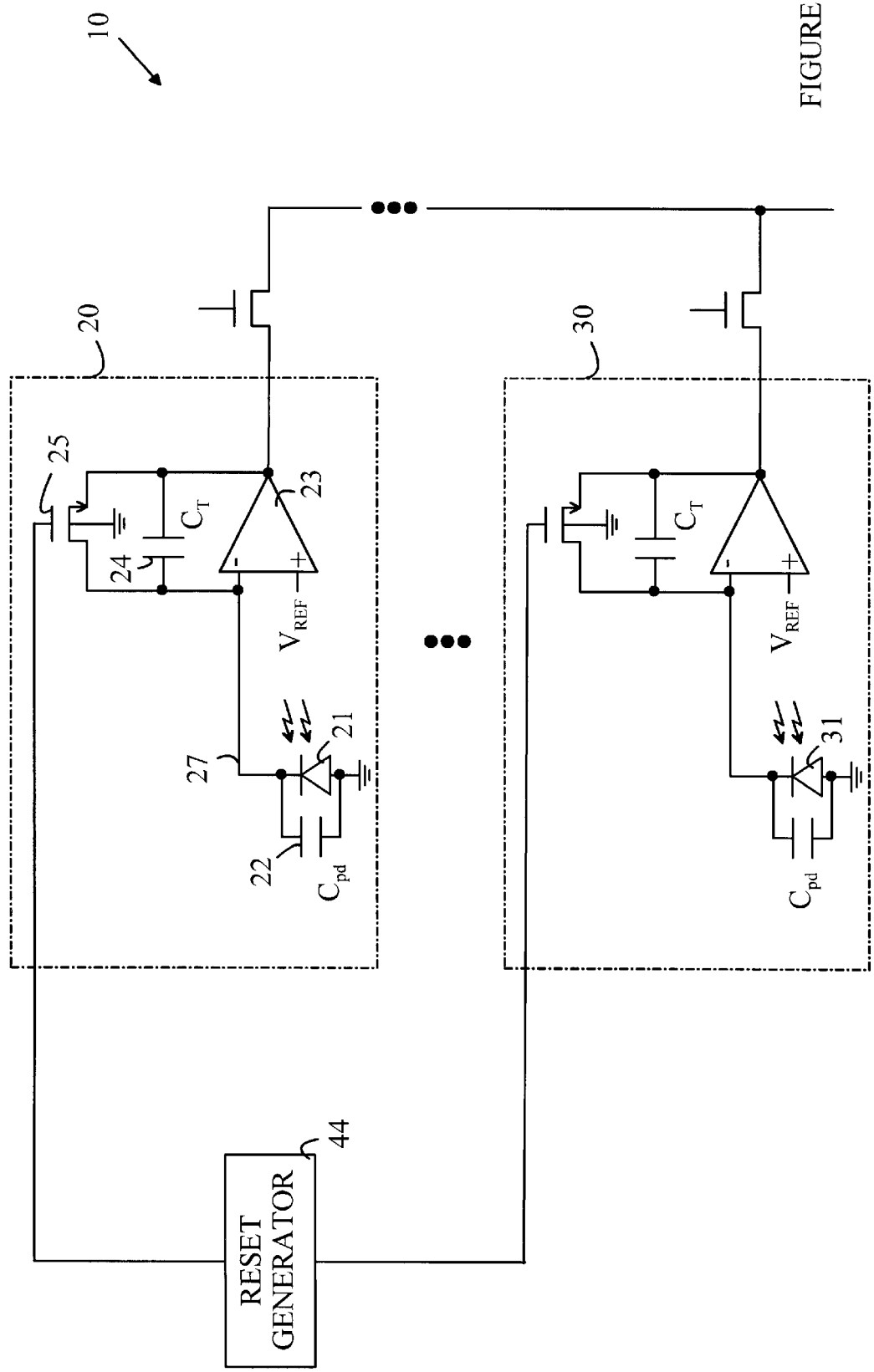
FIG. 1 is a schematic drawing of a portion of an image sensor array 10.

The manner in which the present invention obtains its advantages can be more easily understood with reference to FIG. 1 which is a schematic drawing of a portion of an image sensor array 10. The portion of the array shown in FIG. 1 represents one column of an array used for recording an image. For the purposes of this discussion, the number of dimensions in the array is not important. Exemplary imaging elements are shown at 20 and 30. Each imaging element in the column includes a photodiode and a capacitive transimpedance amplifier. The photodiodes for imaging elements 20 and 30 are shown at 21 and 31, respectively. The photodiode has a parasitic capacitance shown at 22. The capacitance of this capacitor will be denoted by $C_{pd}$ in the following discussion. The transimpedance amplifiers are constructed from an opamp (operational amplifier) and a capacitive feedback loop. The opamp for imaging element 20 is shown at 23, and the feedback capacitor is shown at 24. The capacitance of the feedback capacitor will be denoted by $C_T$ in the following discussion. Each imaging element also has a reset switch for shorting the input and output of the opamp prior to accumulating charge. The reset switch is typically a transistor such as transistor 25.

Figure 2:
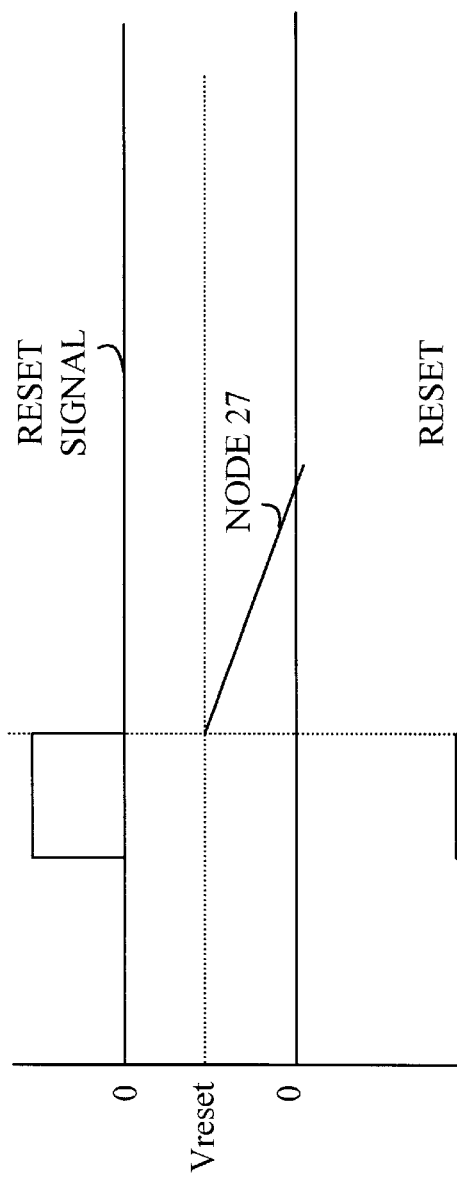
FIG. 2 illustrates the reset signal and potential at node 27 in prior art devices that have been exposed to a high light intensity.

Refer now to FIG. 2, which illustrates the reset signal and potential at node 27 in prior art devices that have been exposed to a high light intensity. The reset switch is operated at the beginning of the image acquisition cycle by pulsing the gate of transistor 25 thereby shorting the output of opamp 23 to the photodiode. During this operation, the output of opamp 23 is held at a positive potential, $V_{ref}$; hence, node 27 is charged to a positive potential and a positive charge is stored on capacitor 22. During the image acquisition cycle, the photocurrent generated by photodiode 21 integrates on capacitor 24. When the output of the amplifier 23 saturates, the potential at node 27 decreases. Normally, the image acquisition cycle ends before amplifier 23 saturates. However, if photodiode 21 is illuminated with a sufficiently intense light, capacitor 22 can become completely discharged, and the potential at node 27 can decrease to a negative potential, thereby causing photodiode 27 to become forward biased. If photodiode 27 becomes forward biased, a current will flow from ground that is much larger than that generated by the photoelectrons produced by the light. As noted above, a portion of this current can reach the adjacent photodiode 31. These additional electrons are collected by photodiode 31 and give the appearance of an increased light intensity at photodiode 31.

Figure 3:
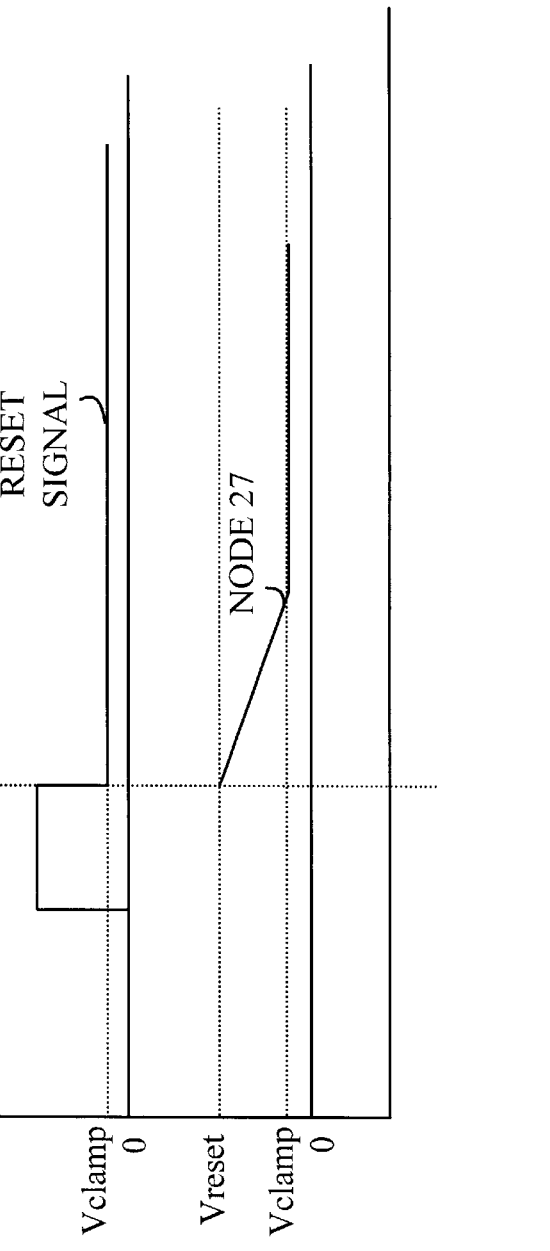
FIG. 3 illustrates the reset signal and potential at node 27 in a pixel, according to the present invention.

The present invention utilizes a clamping circuit to prevent node 27 from becoming forward biased, and hence, avoids blooming. In the preferred embodiment of the present invention, the reset transistor 25 is used as the voltage clamp. Refer now to FIG. 3, which illustrates the reset signal and potential at node 27 in a pixel according to the present invention. After node 27 has been shorted to the output of opamp 23, the reset potential is lowered by reset generator 44 to a value $V_{clamp}$ rather than to ground. As long as the potential at node 27 is greater than $V_{clamp}$, transistor 25 remains in a non-conducting state and the pixel performs normally. However, if the potential at node 27 decreases to a value below $V_{clamp}$, transistor 25 turns on and a current flows from the node at the opamp output to node 27 thereby preventing the voltage at node 27 from decreasing further.

The above-described embodiment of the present invention utilized the reset transistor in each pixel as the voltage-clamping regulator. However, other voltage clamps may be utilized. For example, a separate clamp transistor can be used at each photodiode. In such an embodiment, the source of the transistor is connected to node 27, the drain is to a power rail such as $V_{dd}$, and the gate to $V_{clamp}$.

Various modifications to the present invention will become apparent to those skilled in the art from the foregoing description and accompanying drawings. Accordingly, the present invention is to be limited solely by the scope of the following claims.

What is claimed is:

1. An image sensor comprising:

a photodiode;

a transimpedance amplifier having an input connected to said photodiode and an output, said input having an input potential that varies with the amount of light received by said photodiode; and a clamping circuit for preventing said input potential from causing said photodiode to become forward, biased, wherein said transimpedance amplifier includes a transistor connecting said input to said output, and wherein said clamping circuit comprises a circuit for holding the gate of said transistor at a clamping potential while said input potential varies, said clamping potential being chosen to prevent said photodiode from becoming forward biased.

* * * * *